United States Patent
Van Brunt

(10) Patent No.: US 8,664,991 B1
(45) Date of Patent: Mar. 4, 2014

(54) APPARATUS AND METHODS FOR PHASE-LOCKED LOOPS

(71) Applicant: Analog Devices, Inc., Norwood, MA (US)

(72) Inventor: Roger W Van Brunt, Santa Cruz, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/776,267

(22) Filed: Feb. 25, 2013

Related U.S. Application Data

(60) Provisional application No. 61/756,817, filed on Jan. 25, 2013.

(51) Int. Cl.
*H03L 7/06* (2006.01)

(52) U.S. Cl.
USPC .......................................... 327/156; 327/147

(58) Field of Classification Search
USPC .................................. 327/147, 156
See application file for complete search history.

(56) References Cited

U.S. PATENT DOCUMENTS

| | | | | |
|---|---|---|---|---|
| 5,570,398 A * | 10/1996 | Smith | ........................... | 375/376 |
| 5,774,023 A * | 6/1998 | Irwin | .............................. | 331/17 |
| 6,417,739 B1 * | 7/2002 | Chacko | ........................... | 331/17 |
| 7,492,850 B2 * | 2/2009 | Menolfi et al. | ................ | 375/376 |
| 8,339,165 B2 * | 12/2012 | Dunworth et al. | ............. | 327/152 |
| 2005/0057289 A1 * | 3/2005 | Pham | ............................. | 327/156 |
| 2011/0133799 A1 * | 6/2011 | Dunworth et al. | ............. | 327/157 |
| 2012/0126867 A1 * | 5/2012 | Bae et al. | ....................... | 327/157 |
| 2012/0280730 A1 * | 11/2012 | Obkircher et al. | ............ | 327/157 |
| 2013/0127505 A1 * | 5/2013 | Kanda | ............................ | 327/157 |
| 2013/0181756 A1 * | 7/2013 | Ballantyne et al. | .......... | 327/157 |
| 2013/0241612 A1 * | 9/2013 | Obkircher et al. | ............ | 327/157 |

* cited by examiner

*Primary Examiner* — Adam Houston
(74) *Attorney, Agent, or Firm* — Knobbe Martens Olson & Bear LLP

(57) ABSTRACT

Apparatus and methods for phase-locked loops (PLLs) are provided. In certain implementations, a PLL includes a voltage controlled oscillator (VCO) including first and second frequency control circuits, which are coupled to first and second frequency control inputs, respectively. Additionally, the PLL can further include a loop filter, a high frequency pole circuit, and a low frequency pole circuit. The high frequency pole circuit can be electrically connected between the loop filter's output and the VCO's first frequency control input, and the low frequency pole circuit can be electrically connected between the loop filter's output and the VCO's second frequency control input.

20 Claims, 4 Drawing Sheets

US 8,664,991 B1

APPARATUS AND METHODS FOR PHASE-LOCKED LOOPS

CROSS-REFERENCE TO RELATED APPLICATIONS

The present application claims priority to U.S. Provisional Patent Application No. 61/756,817, filed Jan. 25, 2013, titled "APPARATUS AND METHODS FOR PHASE-LOCKED LOOPS," the entirety of which is hereby incorporated herein by reference.

BACKGROUND

1. Field

Embodiments of the invention relate to electronic systems, and more particularly, to phase-locked loops (PLLs).

2. Description of the Related Technology

Phase-locked loops (PLLs) are used in a variety of applications for generating an output clock signal having a controlled phase and frequency relationship to a reference clock signal. PLLs can be used in, for example, frequency synthesizers, telecommunications systems, and/or chip-to-chip communication.

SUMMARY

In one embodiment, an apparatus includes a voltage controlled oscillator (VCO), a loop filter, a first pole circuit, and a second pole circuit. The VCO is configured to generate an output clock signal, and includes a first frequency control circuit coupled to a first frequency control input and a second frequency control circuit coupled to a second frequency control input. The frequency of the output clock signal is controlled in part by both the first and second frequency control circuits. The first pole circuit is electrically connected in a first signal path between an output of the loop filter and the first frequency control input, and the second pole circuit is electrically connected in a second signal path between the output of the loop filter and the second frequency control input. A pole frequency of the first pole circuit is greater than a pole frequency of the second pole circuit.

In another embodiment, a method of clock signal generation using a phase-locked loop is provided. The method includes generating an output clock signal using a voltage controlled oscillator (VCO) which includes a first frequency control circuit and a second frequency control circuit. The method further includes controlling a frequency of the output clock signal using a loop filter, a first pole circuit, and the first frequency control circuit. The first pole circuit is electrically connected between an output of the loop filter and an input of the first frequency control circuit. The method also includes further controlling the frequency of the output clock signal using the loop filter, a second pole circuit, and the second frequency control circuit. The second pole circuit is electrically connected between the output of the loop filter and an input of the second frequency control circuit, and a pole frequency of the first pole circuit is greater than a pole frequency of the second pole circuit.

In another embodiment, an apparatus includes a means for voltage controlled oscillation, a means for loop filtering, a first pole circuit, and a second pole circuit. The voltage controlled oscillation means is configured to generate an output clock signal, and includes a first frequency control input and a second frequency control input. The frequency of the output clock signal is controlled in part by a voltage level of the first frequency control input and by a voltage level of the second frequency control input. The first pole circuit is electrically connected between an output of the loop filtering means and the first frequency control input, and the second pole circuit is electrically connected between the output of the loop filtering means and the second frequency control input. A pole frequency of the first pole circuit is greater than a pole frequency of the second pole circuit.

DETAILED DESCRIPTION OF EMBODIMENTS

Figure 1:
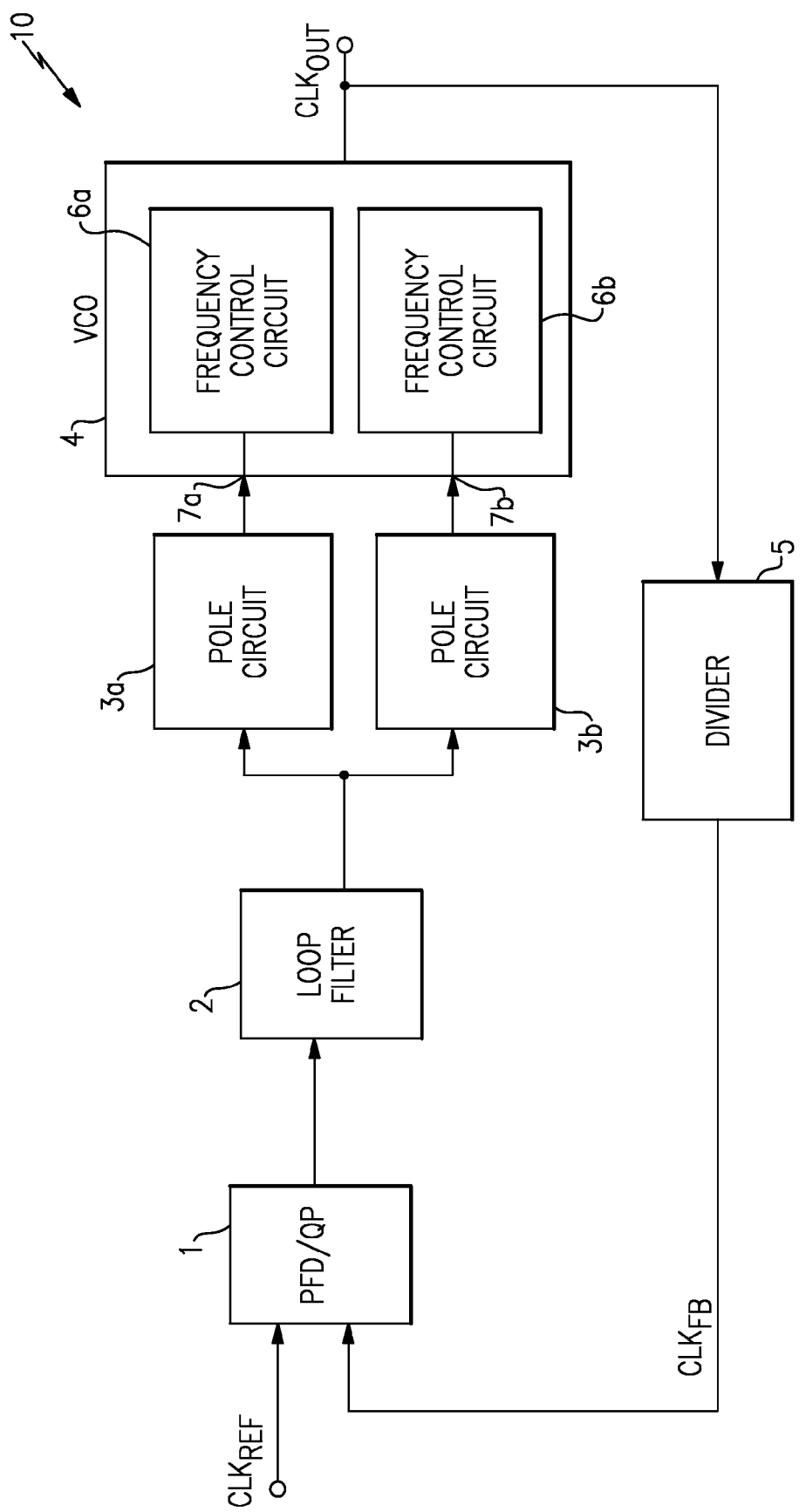
FIG. 1 is a schematic block diagram of one embodiment of a phase-locked loop (PLL).

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Overview of Phase-Locked Loops with Reduced Phase Noise

The phase noise of a phase-locked loop (PLL) can refer to cycle-to-cycle variation or jitter in the phase of an output clock signal generated by the PLL relative to an ideal or perfectly phase-locked output clock signal. The PLLs described herein can have reduced phase noise relative to a conventional PLL implemented with a similar circuit area and power.

In certain implementations, a PLL includes a voltage controlled oscillator (VCO) including first and second frequency control circuits, which are coupled to first and second frequency control inputs, respectively. Additionally, the PLL can further include a loop filter, a high frequency pole circuit, and a low frequency pole circuit. The high frequency pole circuit can be electrically connected between the loop filter's output and the VCO's first frequency control input, and the low frequency pole circuit can be electrically connected between the loop filter's output and the VCO's second frequency control input. Configuring the PLL in this manner can reduce the PLL's phase noise relative to an implementation using a VCO with a single frequency control input of a similar overall frequency control gain.

FIG. 1 is a schematic block diagram of one embodiment of a PLL 10. The PLL 10 includes a phase-frequency detector (PFD) and charge pump 1, a loop filter 2, a first or high frequency pole circuit 3a, a second or low frequency pole circuit 3b, a voltage controlled oscillator (VCO) 4, and a divider 5.

The PFD and charge pump (QP) 1 includes a first input configured to receive a reference clock signal $CLK_{REF}$ and a second input configured to receive a feedback clock signal $CLK_{FB}$. The PFD and charge pump 1 further includes an output electrically connected to an input of the loop filter 2. The loop filter 2 includes an output electrically connected to an input of the high frequency pole circuit $3a$ and to an input of the low frequency pole circuit $3b$. The high frequency pole circuit $3a$ further includes an output electrically connected to a first frequency control input 7a of the VCO 4. The low frequency pole circuit 3b further includes an output electrically connected to a second frequency control input 7b of the VCO 4. The VCO 4 further includes an output configured to generate an output clock signal $CLK_{OUT}$. The divider 5 includes an input configured to receive the output clock signal $CLK_{OUT}$ and an output configured to generate the feedback clock signal $CLK_{FB}$.

The reference clock signal $CLK_{REF}$ can be generated in any suitable manner. In one embodiment, the reference clock signal $CLK_{FEF}$ is generated by a reference oscillator internal to an integrated circuit (IC) on which the PLL 10 is fabricated. However, other configurations are possible.

The PFD and charge pump 1 can include circuitry configured to generate an error signal based on a phase difference and/or frequency difference between the reference clock signal $CLK_{REF}$ and the feedback clock signal $CLK_{FB}$. Additionally, the PFD and charge pump 1 can include charge pump circuitry that can control a flow of current into or out of the input of the loop filter 2 based on the error signal.

The PFD and charge pump 1 can be implemented in any suitable configuration. For example, in one embodiment, the PFD and charge pump 1 includes a first or positive current source operable to source current and a second or negative current source operable to sink current. The PFD and charge pump 1 can further include circuitry such as flip-flops and/or logic gates configured to generate control signals for controlling the positive and negative current sources. Although one example implementation of the PFD and charge pump 1 has been described, the PFD and charge pump 1 can be implemented using a variety of configurations.

The loop filter 2 can be any suitable PLL loop filter, including for example, an active loop filter or a passive loop filter. The loop filter 2 can be used for a variety of purposes, such as to maintain the stability of the PLL 10.

The high frequency pole circuit 3a is electrically connected between the output of the loop filter 2 and the first frequency control input 7a of the VCO 4. Additionally, the low frequency pole circuit 3b is electrically connected between the output of the loop filter 2 and the second frequency control input 7b of the VCO 4. The high and low frequency pole circuits 3a, 3b can each provide a pole in the transfer function of the PLL 10. Additionally, the poles of the high and low frequency pole circuits 3a, 3b can be configured to be at a high frequency and at a low frequency, respectively, such that the pole of the high frequency pole circuit 3a is greater in frequency than the pole of the low frequency pole circuit 3b. As will be described in detail further below, configuring the high and low frequency pole circuits 3a, 3b in this manner can reduce the PLL's phase noise relative to a configuration in which a VCO is implemented to include only a single frequency control input that is controlled by a loop filter.

In certain implementations, the high and/or low frequency pole circuits 3a, 3b can be implemented as passive pole circuits, such as resistor-capacitor (RC) networks. However, other configurations are possible, such as configurations in which the high and/or low frequency pole circuits 3a, 3b are implemented using active circuitry.

The VCO 4 can be implemented using a variety of oscillator configurations, including, for example, an inductor-capacitor (LC) tank oscillator implementation or a rotary travelling wave oscillator (RTWO) implementation. Although two examples of VCOs have been provided, other configurations can be used.

The illustrated VCO 4 includes a first frequency control circuit 6a and a second frequency control circuit 6b. The first and second frequency control circuits 6a, 6b can both be used to control the VCO's oscillation frequency, thereby controlling the frequency of the clock output signal $CLK_{OUT}$. For example, the first and second frequency control circuits 6a, 6b can be implemented using variable impedance elements that can simultaneously control the VCO's oscillation frequency. Although one example of the first and second frequency control circuits 6a, 6b has been described, other configurations are possible. For example, in certain implementations, the first and second frequency control circuits 6a, 6b can control the frequency of oscillation of the VCO 4 by adjusting the voltage level of the VCO's power supply.

As shown in FIG. 1, the first and second frequency control inputs 7a, 7b are electrically connected to the first and second frequency control circuits 6a, 6b, respectively. The voltage levels of the first and second frequency control inputs 7a, 7b can be used to control the VCO's oscillation frequency by controlling the operation of the first and second frequency control circuits 6a, 6b, respectively. For example, in one embodiment, the first and second frequency control circuits 6a, 6b are implemented as varactors, and the first and second frequency control inputs 7a, 7b can control an oscillation frequency of the VCO 4 by controlling the capacitance of the varactors. Thus, the first and second frequency control inputs 7a, 7b can serve as voltage control inputs to the VCO 4.

The divider 5 can be any suitable divider, including for example, an integer or fractional divider. The divider 5 can be implemented to receive a division control signal (not illustrated in FIG. 1). The divider 5 can divide the clock output signal $CLK_{OUT}$ by a division rate indicated by the division control signal to generate the feedback clock signal $CLK_{FBK}$.

The voltage level of the first frequency control input 7a of the VCO 4 can be used to control the frequency of the clock output signal $CLK_{OUT}$. Additionally, the voltage level of the second frequency control input 7b of the VCO 4 can also be used to control the frequency of the clock output signal $CLK_{OUT}$. Thus, the VCO 4 is implemented to include multiple inputs for controlling the frequency of the clock output signal $CLK_{OUT}$. Although the VCO 4 is illustrated as including two frequency control inputs, the VCO 4 can be implemented to include additional frequency control inputs, including, for example, frequency control inputs coupled to additional pole circuits.

A conventional VCO includes a single frequency control input, which can have an associated frequency control gain or Kvco. The Kvco can correspond to a change in the VCO's oscillation frequency for a given change in the voltage level of the frequency control input.

In contrast, the illustrated VCO 4 includes a first frequency control input associated with a first frequency control gain or Kvco1, and a second frequency control input associated with a second frequency control gain or Kvco2.

The frequency control gain or Kvco of a VCO can be constrained by a variety of factors, such as frequency band coverage of the VCO and/or a VCO's frequency variation over changes in temperature and/or power supply voltage. Thus, it may not be practical to reduce the VCO's Kvco for certain PLL applications. However, the Kvco can also contribute to the phase noise of the PLL.

Implementing the VCO 4 to include multiple frequency control inputs coupled to different pole circuits can reduce the phase noise of the PLL 10. For example, when the first frequency control input 7a has a first frequency control gain Kvco1 and the second frequency control input 7b has a second frequency control gain Kvco2, the illustrated configuration can have reduced phase noise relative to a configuration using a single frequency control input having a frequency control gain equal to Kvco1+Kvco2.

Although FIG. 1 illustrates one configuration of a PLL, the teachings herein are applicable to other PLL implementations. For example, the PLL 10 can be adapted to include additional structures, such as additional control circuitry, dividers, filters and/or other circuitry.

Figure 2:
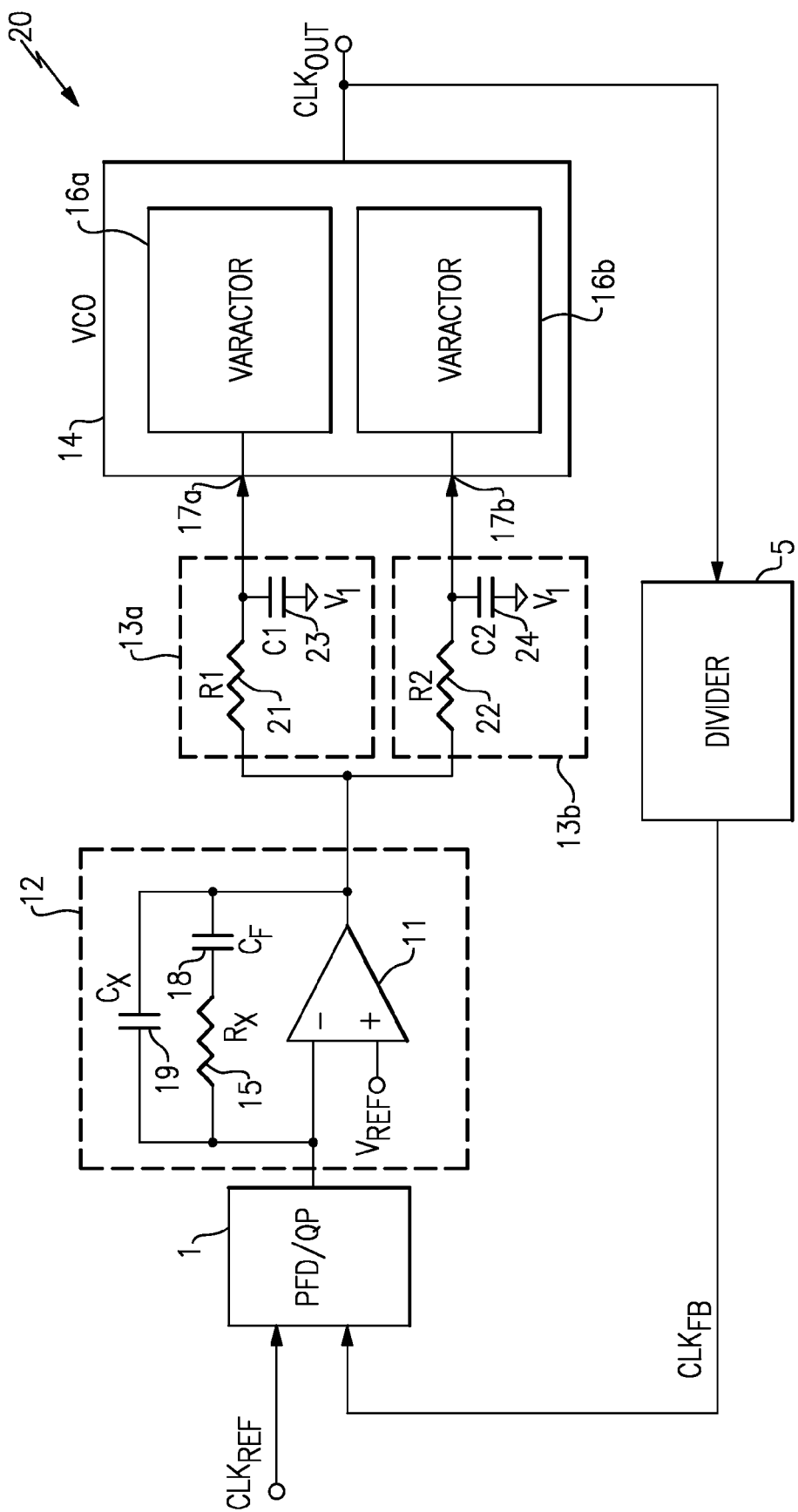
FIG. 2 is a schematic diagram of another embodiment of a PLL.

FIG. 2 is a schematic diagram of another embodiment of a PLL 20. The PLL 20 includes the PFD and charge pump 1 and the divider 5, which can be as described earlier with respect to FIG. 1. The PLL 20 further includes an active loop filter 12, a first or high frequency passive pole circuit 13a, a second or low frequency passive pole circuit 13b, and a VCO 14.

The active loop filter 12 includes an amplifier 11, a filter resistor 15 ($R_X$), a first filter capacitor 18 ($C_F$), and a second filter capacitor 19 ($C_X$). The amplifier 11 includes a first or non-inverting input electrically connected to a reference voltage $V_{REF}$, a second or inverting input electrically connected to the output of the PFD and charge pump 1, and an output. The filter resistor 15 and the first filter capacitor 18 are electrically connected in series between the inverting input and the output of the amplifier 11. The second filter capacitor 19 is electrically connected between the inverting input and the output of the amplifier 11.

The high frequency passive pole circuit 13a includes a first resistor 21 (R1) and a first capacitor 23 (C1), and the low frequency passive pole circuit 13b includes a second resistor 22 (R2) and a second capacitor 24 (C2). The first resistor 21 is electrically connected between the output of the amplifier 11 and a first frequency control input 17a of the VCO 14. The first capacitor 23 is electrically connected between the first frequency control input 17a of the VCO 14 and a first voltage $V_1$. The second resistor 22 is electrically connected between the output of the amplifier 11 and a second frequency control input 17b of the VCO 14. The second capacitor 24 is electrically connected between the second frequency control input 17b of the VCO 14 and the first voltage $V_1$. In certain implementations, the first voltage $V_1$ can be a ground or power low supply. However, other configurations are possible, such as implementations in which the first voltage $V_1$ is a power high supply or a voltage reference.

The voltage level of the first frequency control input 17a of the VCO 14 can be used to control the capacitance of the first varactor 16a, thereby controlling the frequency of the clock output signal $CLK_{OUT}$. Additionally, the voltage level of the second frequency control input 17b can also be used to control the capacitance of the second varactor 16b, thereby also controlling the frequency of the clock output signal $CLK_{OUT}$. Since the oscillation frequency of the VCO 14 can be based in part on a capacitance of the first varactor 16a and on a capacitance of the second varactor 16b, both the first and second frequency control inputs 17a, 17b serve as voltage control inputs of the VCO 14.

The first and second varactors 16a, 16b can be implemented in any suitable manner, including, for example, using diode and/or transistor structures. In one embodiment, the VCO 14 is implemented as a rotary travelling wave oscillator (RTWO), and the first and second varactors 16a, 16b are used to control a characteristic impedance of a differential transmission line of the RTWO. An example of an RTWO is described in commonly-owned U.S. Pat. No. 7,236,060, issued Jun. 26, 2007, and entitled "ELECTRONIC PULSE GENERATOR AND OSCILLATOR," which is hereby incorporated by reference in its entirety.

Although FIG. 2 illustrates a configuration in which the VCO's oscillation frequency is controlled using the first and second varactors 16a, 16b, other configurations are possible. For example, the first and/or second varactors 16a, 16b can be omitted in favor of controlling the oscillation frequency of the VCO 14 in other ways. For example, the first and second frequency control inputs 17a, 17b of the VCO 14 can be configured to control the VCO's frequency by adjusting the voltage level of the VCO's power supply or by using other variable impedance configurations.

In certain implementations, the high frequency passive pole circuit 13a is configured to have a corresponding pole at a relatively high frequency, such as a frequency that is a factor of about 4 times to about 8 times greater than the closed-loop bandwidth of the PLL 20. Additionally, the low frequency passive pole circuit 13b can be configured to have a corresponding pole at a relatively low frequency, such as a frequency that is a factor of about 25 times to about 30 times less than the PLL's closed-loop bandwidth. Thus, in certain implementations, the pole of the high frequency passive pole circuit 13a is greater than the PLL's closed-loop bandwidth, and the pole of the low frequency passive pole circuit 13b is less than the PLL's closed-loop bandwidth. Although examples of suitable pole frequency locations have been provided, other configurations are possible, including, for example, frequency values associated with particular design constraints.

Configuring the high frequency passive pole circuit 13a to have a high pole frequency and the low frequency passive pole circuit 13b to have a low pole frequency can reduce the PLL's noise. For example, the VCO 14 has been implemented to effectively split a frequency control gain or Kvco between multiple paths or branches that are associated with different pole frequencies. The pole frequencies can be selected such that the VCO 14 has a sufficient frequency control gain to achieve desired PLL loop dynamics, while having a relatively small impact on the PLL's noise.

As persons of ordinary skill in the art will appreciate, the pole frequency of the low frequency passive pole circuit 13b can based on a product of the resistance of the second resistor 22 and a capacitance of the second capacitor 24. In certain implementations, the size of the second capacitor 24 is configured to be relatively small by configuring the second resistor 22 to be relatively large, but small enough to provide a relatively small noise contribution to the PLL 20.

Figure 3:
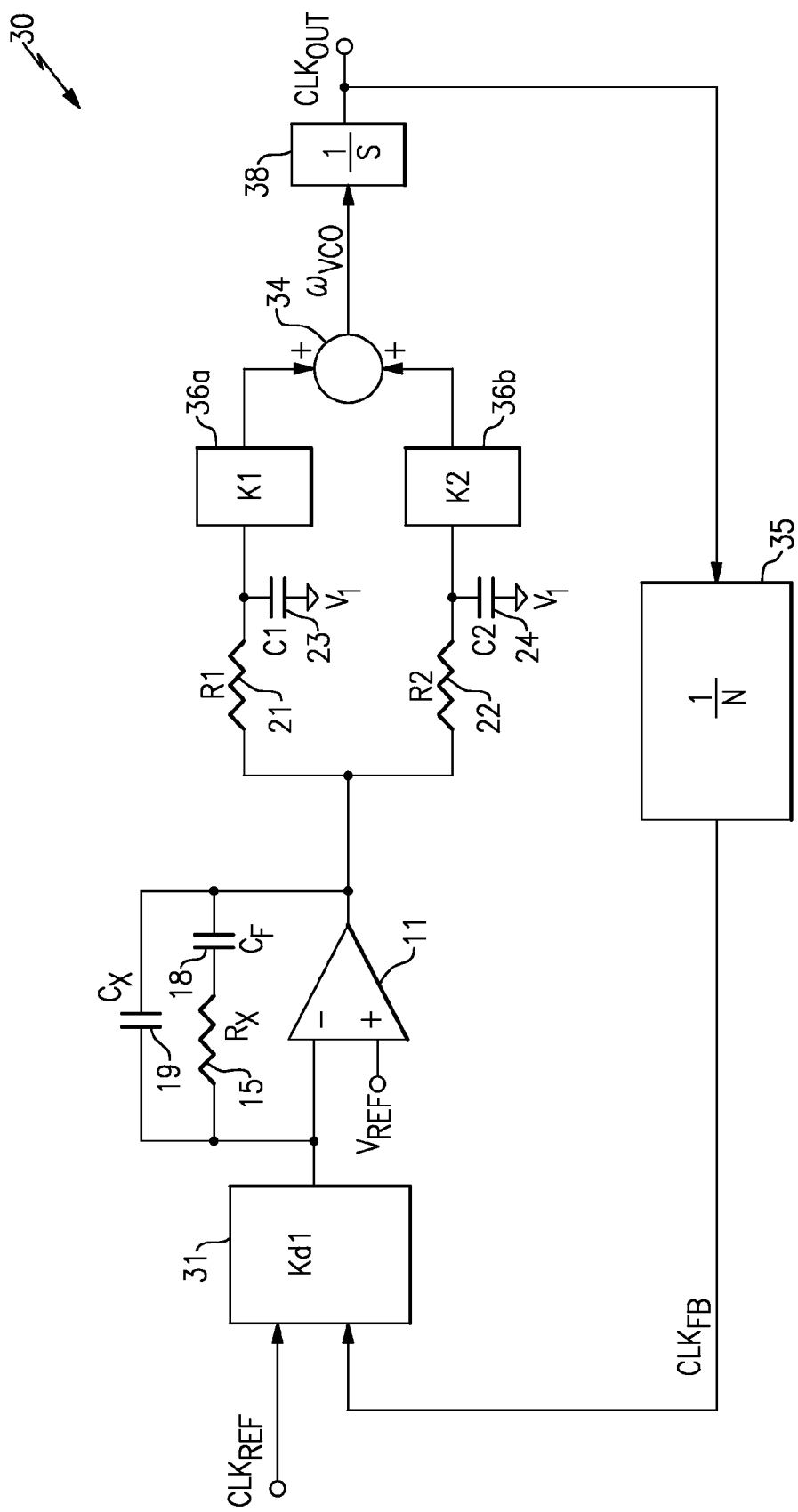
FIG. 3 is a schematic diagram of the PLL of FIG. 2 including mathematical annotations and blocks in the Laplace domain (s-domain).

FIG. 3 is a schematic diagram 30 of the PLL 20 of FIG. 2 including mathematical annotations in the Laplace domain (s-domain).

As shown in FIG. 3, the VCO 14 of FIG. 2 can be mathematically modeled using a first branch 36a and a second branch 36b having gains K1 and K2, respectively. In certain implementations, K1+K2=K such that K1=α*K, where α is less than 1 but greater than 0. The VCO 14 of FIG. 2 can be further modeled using an adder 34 and a frequency-to-phase conversion or 1/s block 38. The adder 34 can have an output $\omega_{VCO}$ representing the VCO's angular frequency of oscillation, and the frequency-to-phase conversion block 38 can represent a mathematical conversion from angular frequency to phase. Although FIG. 3 illustrates a phase model of the PLL 20 of FIG. 2, skilled artisans will readily appreciate that the PLL 20 of FIG. 2 can be modeled in other ways.

The first resistor 21 and the first capacitor 23 can have a resistance of R1 and a capacitance of C1, respectively. Additionally, the first resistor 21 and the first capacitor 23 can have a corresponding high frequency pole p1 about equal to $1/(2*\pi*R1*C1)$, where π is the mathematical constant pi. Additionally, the second resistor 22 and the second capacitor 24 can have a resistance of R2 and a capacitance of C2, respectively. Additionally, the second resistor 22 and the second capacitor 24 can have a corresponding low frequency pole p2 about equal to $1/(2*\pi*R2*C2)$.

As shown in FIG. 3, the PFD and charge pump 1 of FIG. 2 can be modeled to have a gain Kd1. Additionally, the divider 5 of FIG. 2 can be mathematically modeled using a division block 35. The division block 35 can have a division rate of N, where N is a fraction or integer.

When K1, K2, p1, and p2 are configured to have suitable values, a gain Kd1 of the PFD and charge pump 1 of FIG. 2 can be effectively increased by $1/\alpha$ for a given PLL bandwidth and gain. As such, in certain implementations a dual or multi-path PLL can be associated with gain redistribution. For example, while the gain of the VCO 14 associated with the first frequency control input 17a of FIG. 2 can be reduced to be about equal to K1, which can be equal to $\alpha*K$, the gain Kd1 of the PFD and charge pump 1 of FIG. 2 can be effectively increased by $1/\alpha$ to compensate for overall loop gain. However, the gain redistribution can also lower the contribution to phase noise from the certain noise sources, such as the charge pump, the active loop filter, the voltage reference $V_{REF}$, and the active loop filter's resistors.

Figure 4:
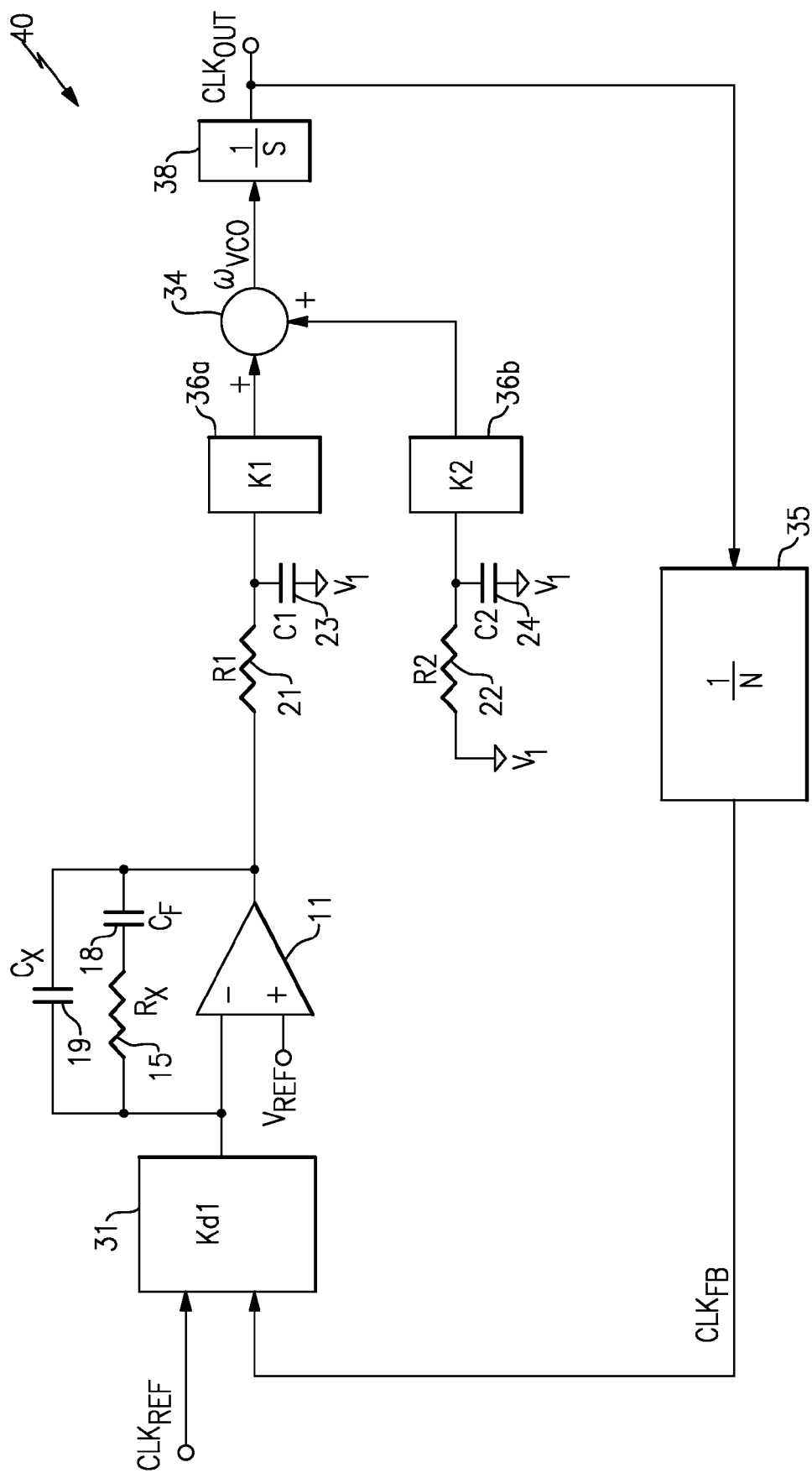
FIG. 4 is another schematic diagram of the PLL of FIG. 2 including mathematical annotations and blocks in the Laplace domain.

FIG. 4 is another schematic diagram 40 of the PLL of FIG. 2 including mathematical annotations in the Laplace domain.

The schematic diagram 40 illustrates a model of the PLL 20 of FIG. 2 associated with certain PLL constraints.

For example, the diagram 40 corresponds to a PLL configured such that $K=K1+K2$, and such that $K1=\alpha*K$. Additionally, the diagram 40 corresponds to a configuration in which $K1*p1 \gg K2*p2$, where p1 and p2 are as defined earlier. Furthermore, the diagram 40 corresponds to a configuration in which $p2*(1+K2/K1)<z/2$, where $z=1/(2*\pi*R_X*C_F)$ and $p1>(16/(2\pi))\text{sqrt}(Kd1*K1/((C_X+C_F)*N))$, where N is the division rate of the feedback divider 5, $R_X$ is the resistance of the filter resistor 15, $C_F$ is the capacitance of the first filter capacitor 18, and $C_X$ is the capacitance of the second filter capacitor 19. Although various PLL constraints have been described above, other configurations are possible.

In the illustrated configuration, the VCO's gain has been effectively reduced by $\alpha$. Additionally, the gain Kd1 of the PFD and charge pump 1 has been effectively increased by $1/\alpha$, thereby keeping the PLL's loop bandwidth and gain effectively the same. Furthermore, the redistribution of gain can reduce the contribution to phase noise from a variety of sources, including, for example, the charge pump, the voltage reference $V_{REF}$, the amplifier 11, the filter resistor 15, and the first resistor 21.

As shown in FIG. 4, the second resistor 22 can appear to be effectively grounded from a noise perspective and loop dynamic perspective under certain conditions. Thus, under these conditions, the second frequency control gain Kvco2 associated with the second resistor 22 and the second capacitor 24 can have a relatively small impact on the phase noise of the PLL as well as on the dynamics of the PLL, such as the PLL's bandwidth, stability, and/or settling time.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a voltage controlled oscillator (VCO) configured to generate an output clock signal, wherein the VCO comprises:
      a first frequency control circuit coupled to a first frequency control input; and
      a second frequency control circuit coupled to a second frequency control input, wherein a frequency of the output clock signal is controlled in part by both the first and second frequency control circuits;
   a loop filter;
   a first pole circuit electrically connected in a first signal path between an output of the loop filter and the first frequency control input; and
   a second pole circuit electrically connected in a second signal path between the output of the loop filter and the second frequency control input,
   wherein a pole frequency of the first pole circuit is greater than a pole frequency of the second pole circuit.

2. The apparatus of claim 1, wherein the first frequency control circuit comprises a first varactor, and wherein the second frequency control circuit comprises a second varactor.

3. The apparatus of claim 1, wherein the loop filter comprises an active loop filter.

4. The apparatus of claim 3, wherein the loop filter comprises:
   an amplifier including a first input, a second input, and an output, wherein the first input is configured to receive a reference voltage, and wherein the output of the amplifier is configured to operate as the output of the loop filter;
   a first filter resistor; and
   a first filter capacitor, wherein the first filter resistor and the first filter capacitor are electrically connected in series between the second input and the output of the amplifier.

5. The apparatus of claim 4, further comprising a second filter capacitor electrically connected between the second input and the output of the amplifier.

6. The apparatus of claim 1, further comprising a divider configured to divide the output clock signal to generate a feedback clock signal.

7. The apparatus of claim 6, further comprising a phase-frequency detector (PFD) and a charge pump, wherein the PFD is configured to compare the feedback clock signal to a reference clock signal to generate an error signal, and wherein the charge pump includes an input configured to receive the error signal and an output electrically connected to an input of the loop filter.

8. The apparatus of claim 1, wherein the first and second pole circuits are implemented as passive pole circuits.

9. The apparatus of claim 8, wherein the first pole circuit comprises a first resistor and a first capacitor, wherein the first resistor is electrically connected between the first frequency control input and the output of the loop filter, wherein the first capacitor is electrically connected between the first frequency control input and a first voltage, wherein the second pole circuit comprises a second resistor and a second capacitor, wherein the second resistor is electrically connected between the second frequency control input and the output of the loop filter, and wherein the second capacitor is electrically connected between the second frequency control input and the first voltage.

10. The apparatus of claim 1, wherein the pole frequency of the first pole circuit is greater than a closed-loop bandwidth of the apparatus, and wherein the pole frequency of the second pole circuit is less than the closed-loop bandwidth.

11. The apparatus of claim 10, wherein the pole frequency of the first pole circuit is about 4 times to about 8 times greater than the closed-loop bandwidth, and wherein the pole frequency of the second pole circuit is about 25 times to about 30 times less than the closed-loop bandwidth.

12. The apparatus of claim 1, wherein the first frequency control circuit and the second frequency control circuit each comprise varactors, wherein the VCO further comprises a rotary travelling wave oscillator.

13. A method of clock signal generation using a phase-locked loop, the method comprising:
generating an output clock signal using a voltage controlled oscillator (VCO), wherein the VCO includes a first frequency control circuit and a second frequency control circuit;
controlling a frequency of the output clock signal using a loop filter, a first pole circuit, and the first frequency control circuit, wherein the first pole circuit is electrically connected between an output of the loop filter and an input of the first frequency control circuit; and
further controlling the frequency of the output clock signal using the loop filter, a second pole circuit, and the second frequency control circuit, wherein the second pole circuit is electrically connected between the output of the loop filter and an input of the second frequency control circuit,
wherein a pole frequency of the first pole circuit is greater than a pole frequency of the second pole circuit.

14. The method of claim 13, further comprising filtering an output of a charge pump using the loop filter.

15. The method of claim 14, further comprising dividing the output clock signal to generate a feedback clock signal using a divider.

16. The method of claim 15, further comprising generating an error signal by comparing the feedback clock signal to a reference clock signal, and controlling the output of the charge pump using the error signal.

17. The method of claim 13, wherein the pole frequency of the first pole circuit is greater than a closed-loop bandwidth of the phase-locked loop, and wherein the pole frequency of the second pole circuit is less than the closed-loop bandwidth.

18. The method of claim 17, wherein the pole frequency of the first pole circuit is about 4 times to about 8 times greater than the closed-loop bandwidth, and wherein the pole frequency of the second pole circuit is about 25 times to about 30 times less than the closed-loop bandwidth.

19. The method of claim 13, wherein the first frequency control circuit and the second frequency control circuit each comprise varactors, wherein the VCO further comprises a rotary travelling wave oscillator.

20. An apparatus comprising:
a means for voltage controlled oscillation configured to generate an output clock signal, wherein the voltage controlled oscillation means comprises a first frequency control input and a second frequency control input, wherein a frequency of the output clock signal is controlled in part by a voltage level of the first frequency control input and by a voltage level of the second frequency control input;
a means for loop filtering;
a first pole circuit electrically connected between an output of the loop filtering means and the first frequency control input; and
a second pole circuit electrically connected between the output of the loop filtering means and the second frequency control input,
wherein a pole frequency of the first pole circuit is greater than a pole frequency of the second pole circuit.

* * * * *